US012791645B2

(12) United States Patent
Maruyama et al.

(10) Patent No.: US 12,791,645 B2
(45) Date of Patent: Nov. 10, 2026

(54) DATA GENERATION APPARATUS, DATA GENERATION METHOD, AND NONVOLATILE COMPUTER-READABLE STORAGE MEDIUM STORING DATA GENERATION PROGRAM

(71) Applicant: Canon Kabushiki Kaisha, Tokyo (JP)

(72) Inventors: Shuki Maruyama, Nasushiobara (JP); Hidenori Takeshima, Taito (JP)

(73) Assignee: Canon Kabushiki Kaisha, Tokyo (JP)

( * ) Notice: Subject to any disclaimer, the term of this patent is extended or adjusted under 35 U.S.C. 154(b) by 337 days.

(21) Appl. No.: 18/473,366

(22) Filed: Sep. 25, 2023

(65) Prior Publication Data

US 2024/0112349 A1 Apr. 4, 2024

(30) Foreign Application Priority Data

Sep. 26, 2022 (JP) ................................ 2022-152711

(51) Int. Cl.

*G01R 33/485* (2006.01)
*G06T 7/11* (2017.01)
*G06T 7/60* (2017.01)

(52) U.S. Cl.

CPC .............. *G01R 33/485* (2013.01); *G06T 7/11* (2017.01); *G06T 7/60* (2013.01); *G06T 2207/10088* (2013.01); *G06T 2207/20081* (2013.01); *G06T 2207/20084* (2013.01); *G06T 2207/30016* (2013.01)

(58) Field of Classification Search

CPC ........... G01R 33/485; G06T 7/11; G06T 7/60; G06T 2207/10088; G06T 2207/20081; G06T 2207/20084; G06T 2207/30016

See application file for complete search history.

(56) References Cited

U.S. PATENT DOCUMENTS

| | | | | |
|---|---|---|---|---|
| 10,482,600 | B2 | 11/2019 | Zhou et al. | |
| 2018/0024215 | A1* | 1/2018 | Zhu | G01R 33/543 324/309 |
| 2020/0275857 | A1* | 9/2020 | Lou | G01R 33/50 |
| 2020/0292476 | A1* | 9/2020 | Laleg | G01R 33/46 |

(Continued)

FOREIGN PATENT DOCUMENTS

| | | | | |
|---|---|---|---|---|
| JP | 2022-529944 | A | 6/2022 | |
| WO | WO-2020106896 | A1 * | 5/2020 | G01R 33/4625 |

OTHER PUBLICATIONS

Weigand-Whittier et al. "Accelerated and Quantitative 3D Semi-solid MT/CEST Imaging using a Generative Adversarial Network (GAN-CEST)." arXiv preprint arXiv:2207.11297 (Jul. 2022). (Year: 2022).*

(Continued)

*Primary Examiner* — Katrina R Fujita

(74) *Attorney, Agent, or Firm* — Oblon, McClelland, Maier & Neustadt, L.L.P.

(57) ABSTRACT

A data generation apparatus according to one embodiment includes processing circuitry. The processing circuitry receives a relative value of molecules in a first region as input data. The processing circuitry applies, to the input data, a function having predetermined coefficients to be learned. The processing circuitry computes a relative value of the molecules in a second region to be output data from the function. The processing circuitry outputs the output data.

12 Claims, 9 Drawing Sheets

(56) References Cited

U.S. PATENT DOCUMENTS

| | | | | |
|---|---|---|---|---|
| 2022/0018922 | A1 | 1/2022 | Shim et al. | |
| 2022/0117552 | A1* | 4/2022 | Kim | A61B 5/4064 |
| 2022/0343475 | A1* | 10/2022 | Zhang | G06T 5/60 |
| 2022/0413077 | A1* | 12/2022 | Zeller | G01R 33/5608 |

OTHER PUBLICATIONS

Su et al. "Predicting cancer malignancy and proliferation in glioma patients: intra-subject inter-metabolite correlation analyses using MRI and MRSI contrast scans." Quantitative Imaging in Medicine and Surgery 11.6 (2021): 2721. (Year: 2021).*

Stadlbauer et al. "Radiophysiomics: brain tumors classification by machine learning and physiological MRI data." Cancers 14.10 (May 2022): 2363. (Year: 2022).*

Isola et al., "Image-to-Image Translation with Conditional Adversarial Networks", arXiv:1611.07004v3 [cs.CV], Nov. 26, 2018, 17 pages.

Takeshima, "Deep Learning and Its Application to Function Approximation for MR in Medicine: An Overview", Magnetic Resonance in Medical Sciences, Sep. 17, 2021, 16 pages, doi: 10.2463/mrms.rev.2021-0040.

Extended European Search Report issued Feb. 5, 2024, in corresponding European Patent Application No. 23199203.3, 9 pages.

Office Action issued Apr. 28, 2026. in corresponding Japanese Patent Application No. 2022-152711, 8 pages.

* cited by examiner

DATA GENERATION APPARATUS, DATA GENERATION METHOD, AND NONVOLATILE COMPUTER-READABLE STORAGE MEDIUM STORING DATA GENERATION PROGRAM

CROSS-REFERENCE TO RELATED APPLICATION

This application is based upon and claims the benefit of priority from Japanese Patent Application No. 2022-152711, filed on Sep. 26, 2022, the entire contents of which are incorporated herein by reference.

FIELD

Embodiments described herein relate generally to a data generation apparatus, a data generation method, and a nonvolatile computer-readable storage medium storing a data generation program.

BACKGROUND

Traditionally, deep generative models are trained using training data. By learning a large amount of training data, a deep generative model can generate accurately rendered images. Having learned training data with large variations, however, the trained deep generative model may generate less accurate or less reliable data.

For example, it is known that magnetic resonance imaging (MRI) apparatuses can generate MR images representing morphological information and also measure chemical shift signals that allow easier discrimination of molecules than the MR images. In view of this, it is considered that the deep generative model is trained to generate artificial data, using a large amount of quantitative estimate data of molecules in vivo obtained by, for example, magnetic resonance (MR) spectroscopy, which is one of chemical-shift-signal measuring methods.

However, training data based on the quantitative estimates of molecules by MR spectroscopy may have large variations. Because of this, the trained deep generative model having learned such training data with large variations may generate less reliable artificial data dissimilar to actual data.

DETAILED DESCRIPTION

An object of embodiments disclosed in this specification and the accompanying drawings is to generate reliable data, although it is not construed as limiting. Other objects corresponding to the effects of the respective elements specified in the following embodiments may be conceivable.

A data generation apparatus according to one embodiment includes processing circuitry. The processing circuitry receives a relative value of molecules in a first region as input data. The processing circuitry applies a function to the input data, the function having predetermined coefficients to be learned. The processing circuitry computes a relative value of the molecules in a second region to be output data from the function. The processing circuitry outputs the output data.

Hereinafter, embodiments of a data generation apparatus, a data generation method, and a data generation program will be described in detail with reference to the accompanying drawings. The following embodiments will omit redundant description of parts or elements denoted by the same reference signs that perform similar processing, when appropriate. Some embodiments will be explained below with reference to the drawings.

The data generation apparatus that handles various kinds of medical data can be, for example, implemented as a medical data processing apparatus. The data generation apparatus that handles various kinds of non-medical data can be, for example, implemented as a non-medical data processing apparatus (e.g., for use in various kinds of experiments and tests). For the sake of specificity, various kinds of data to be applied to the data generation apparatus are defined as medical data herein.

The elements of the data generation apparatus may be, for example, incorporated in a console of a magnetic resonance imaging (MRI) apparatus, any of various kinds of workstation such as a radiology information systems (RIS) server or a picture archiving and communication systems (PACS), or a radiogram interpretation server.

Embodiment

Figure 1:
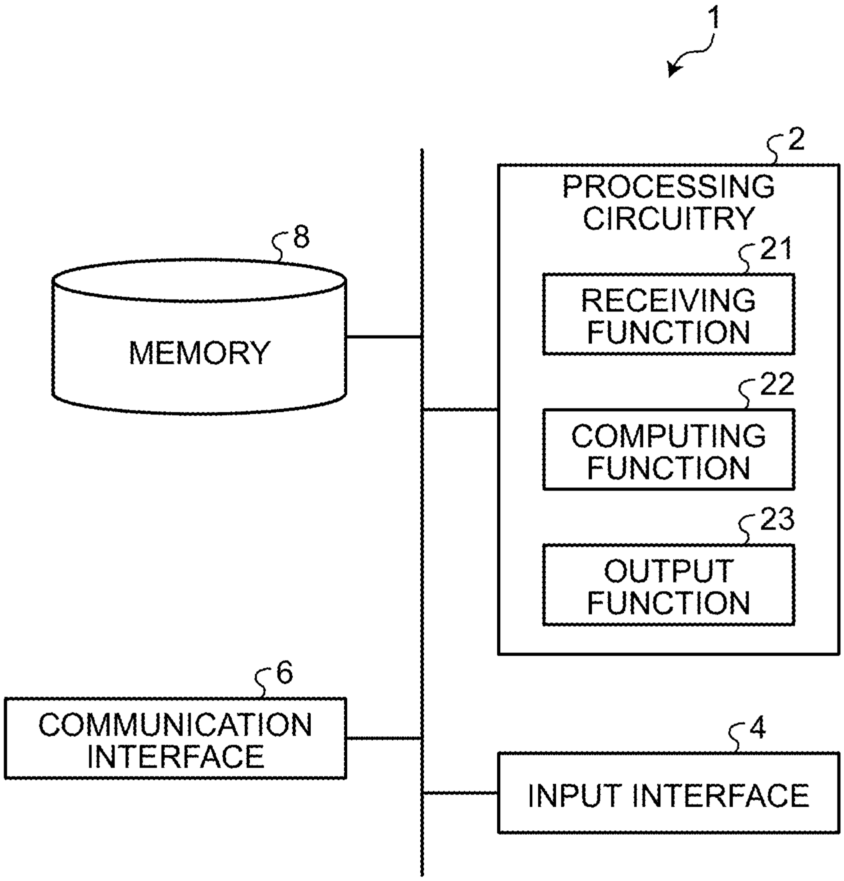
FIG. 1 illustrates an exemplary configuration of a data generation apparatus according to some embodiments.

A data generation apparatus according to some embodiments will be described. FIG. 1 illustrates an exemplary configuration of a data generation apparatus 1. The data generation apparatus 1 includes processing circuitry 2, an input interface 4, a communication interface 6, and a memory 8. The data generation apparatus 1 may additionally include a display. Under the control of an output function 23, the display displays, for example, images computed by a computing function 22 and/or a graphical user interface (GUI) that receives various kinds of inputs. Examples of the display include a cathode ray tube (CRT) display, a liquid crystal display (LCD), an organic electroluminescence display (OELD), a light emitting diode (LED) display, a plasma display, any other display known in related art, and a display device such as a monitor.

The processing circuitry 2 includes a receiving function 21, the computing function 22, and the output function 23. The processing circuitry 2 can be implemented by a hardware resource, i.e., a processor (not illustrated). Thus, the processing circuitry 2 can be a processor that retrieves and executes computer programs from the memory 8 to implement the functions corresponding to the respective computer programs. In other words, the processing circuitry 2 includes the functions shown in the processing circuitry 2 of FIG. 1 after retrieving the respective computer programs.

FIG. 1 depicts a single piece of processing circuitry 2 including the receiving function 21, the computing function 22, and the output function 23 to implement the processing and functions. However, the processing circuitry 2 may be constituted of a combination of multiple independent processors so that the individual processors execute the computer programs to implement the respective functions. In other words, the respective functions may be configured as computer programs to be executed by the single piece of processing circuitry 2. Alternatively, particular functions may be implemented on dedicated, independent circuitry that executes the computer programs.

The term "processor" used herein refers to circuitry, such as a central processing unit (CPU), a graphics processing unit (GPU), an application specific integrated circuit (ASIC), a programmable logic device (e.g., simple programmable logic device (SPLD)), a complex programmable logic device (CPLD), and a field programmable gate array (FPGA)). The processor serves to implement the functions by retrieving and executing the computer programs from the memory 8.

The computer programs may be directly embedded in the circuitry of the processor, in place of being stored in the memory 8. In this case the processor implements the functions by retrieving and executing the computer programs from the circuitry.

The processing circuitry 2 uses the receiving function 21 to receive relative values of molecules in a first region as input data. The molecules correspond to, for example, substances produced by the metabolism of a subject, i.e., metabolites. In other words, the molecules are exemplified by metabolites. The receiving function 21 receives or obtains the relative values from the MRI apparatus and/or the PCAS server, for example. The relative values are, for example, computed by the MRI apparatus and/or the PCAS server. Alternatively, the relative values may be generated by the processing circuitry 2. The receiving function 21 that obtains the relative values may be referred to as an obtaining function (obtainer unit). The relative values will be explained in detail below.

The input data may include data acquired from measurements of the same subject. The measurements are, for example, chemical shift measurements. The chemical shift measurement can be implemented by, for example, MR imaging of the subject based on magnetic resonance spectroscopy (hereinafter, MRS) or MR imaging of the subject based on chemical exchange saturation transfer (CEST) (hereinafter, CEST imaging). For the sake of simpler explanation, the measurement is exemplified herein by MRS or chemical shift imaging (CSI) being one of chemical shift measuring methods.

CSI may also be referred to as magnetic resonance spectroscopic imaging (MRSI). In MRS, for example, a single spectrum is computed for multiple voxels included in the first region while in CSI or MRSI, for example, a single spectrum is computed per predetermined range in the first region. Namely, in CSI or MRSI, multiple spectra corresponding to the predetermined ranges of the first region are computed, for example. Thus, by CSI or MRSI, a relative-value map indicating the densities of the respective molecules in the first region is generated based on the multiple spectra. The relative value is defined as a relative amount of a spectrum of interest with respect to a reference spectrum.

The first region is defined as, for example, a region of interest (ROI) preset on a morphological image of the subject. The morphological image represents an internal anatomical structure of the subject. The morphological image includes part of a region of the subject and is exemplified by, but not limited to, a sagittal-plane image of the subject. The morphological image can be any cross-sectional image of the subject such as a coronal-plane image or an axial-plane image. The type of the morphological image is an MR image generated by the MRI apparatus. The first region may be suitably set by the user through the input interface 4.

The molecules are metabolites produced inside the subject body, as described above. Examples of the metabolites include N-acetylaspartate (NAA), creatine (Cr), and choline (Cho). The molecules can be any molecules other than NAA, Cr, and Cho.

The relative value of each molecule is generated according to, for example, spectrum data based on MR data acquired by MRS, spectrum data based on MR data acquired by CEST imaging, and a metabolite map representing an image of each metabolic substance based on the spectrum data. The values of metabolic substances in the spectrum data and the pixel values in the metabolite map correspond to, for example, estimated densities of molecules (hereinafter, density estimates).

The relative value represents, for example, a relationship between molecules in a chemical shift band. For example, the molecular relative value is an estimate obtained by using any of MRS, MRSI, and CEST imaging. Specifically, the relative value is defined as a value obtained by dividing the density estimate of a first molecule by the density estimate of a second molecule among the molecules.

Figure 2:
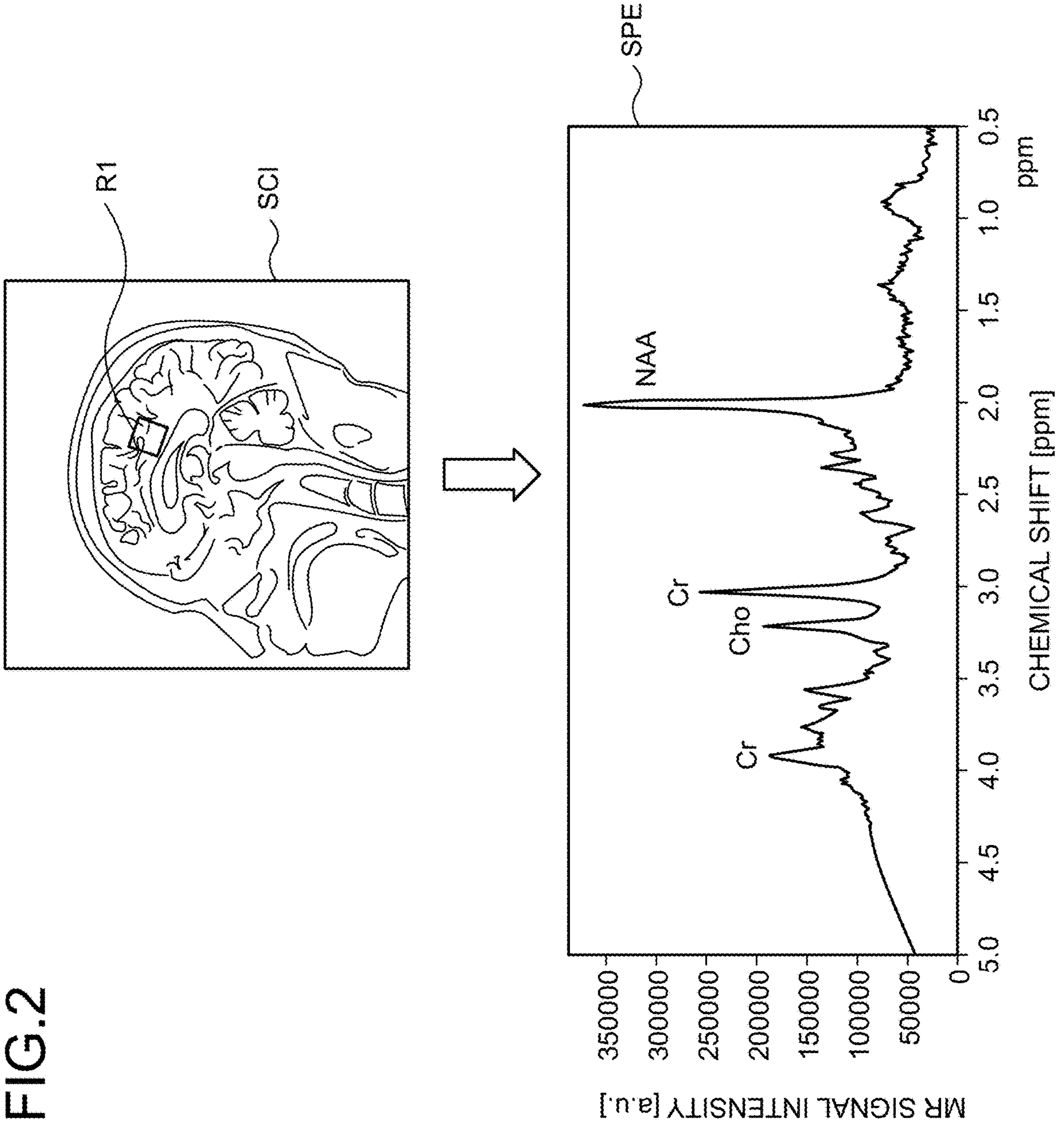
FIG. 2 illustrates a first region set on a sagittal-plane image and a spectrum of intensities of MR signals in the first region according to some embodiments, by way of example.

FIG. 2 illustrates a first region R1 set on a sagittal-plane image SCI and a spectrum SPE of intensities of MR signals in the first region R1, by way of example. As illustrated in the spectrum SPE of FIG. 2, the longitudinal axis indicates MR-signal intensity values in arbitrary unit (a.u.) while the transverse axis indicates differences from the reference frequency, in other words, chemical shift (ppm). The dimension of the first region R1 is set to, but not limited to, width 2.0 cm×depth 2.0 cm×height 2.0 cm.

The first region R1 is subjected to MRS. The spectrum SPE is generated from the data acquired by MRS. The receiving function 21 receives relative values based on the generated spectrum SPE. In the spectrum SPE of FIG. 2, the chemical shift band ranges from 0.5 to 5.0 ppm. As illustrated in FIG. 2, the chemical shift band corresponds to a frequency band, and the relationship between the molecules is calculated from the signal intensity values.

By analyzing the MR-signal intensity values in the spectrum SPE, the densities of the molecules as N-acetylaspartate (NAA), creatine (Cr), and choline (Cho) can be inferred. Such an analysis can be performed by known quantitative analysis software for MRS metabolites. The relative value of each molecule in the first region R1 is obtained by, for example, dividing the density estimate of each molecule by the density estimate of another molecule. Other metabolites may be set as, but not particularly limited to, creatine or N-acetylaspartate, for example.

The processing circuitry 2 uses the receiving function 21 to receive or obtain two-dimensional or three-dimensional MR images. For example, the receiving function 21 receives or obtains MR images from the MRI apparatus and/or the PCAS server. The MR image is, for example, a morphological image including a T1 weighted image, a T2 weighted image, a fluid attenuated inversion recovery (FLAIR) image, a T2* weighted image, a diffusion weighted image, or a proton density weighted image. These images may be captured before or after injection of a contrast agent or can be input datasets with different resolutions. The receiving function 21 stores the received relative values and MR images in the memory 8. The processing circuitry 2 implementing the receiving function 21 corresponds to a receiver unit.

The processing circuitry 2 uses the computing function 22 to apply an arithmetic function to the input data. The function has predetermined coefficients to be learned. The input data is exemplified by the relative values received by the receiving function 21. Specifically, the computing function 22 computes output data by applying the function and the relative values of the molecules in the first region R1 to the morphological image received by the receiving function 21. In this case the morphological image and the relative values for the first region R1 are input data to the function. The computing function 22 computes the relative values of the molecules in a second region to be output data from the function.

The second region includes a different region from the first region R1 on the morphological image including the first region R1. In other words, part of the second region may or may not overlap with the first region R1. The second region may have the same size (same area or volume and/or same shape) as the first region R1 or may have a larger size than the first region R1. The second region and the first region R1 may be set on different slices.

The function used by the computing function 22 has predetermined coefficients to be learned. The function can be implemented by, for example, a trained model. The trained model serving as the function can be implemented by, for example, a trained neural network. The coefficients of the function serving as the trained model correspond to weighted coefficients to be learned by the neural network. In the training process of a non-trained neural network, the coefficients are determined such that a loss function representing differences between results of applying the function to known training data and answer data relative to the training data decreases. The coefficients can be continuously learned (updatable by further training) by the trained model through continued learning. The function as the trained model is stored in the memory 8. The processing circuitry 2 implementing the computing function 22 corresponds to a computing unit.

The trained model can be, for example, implemented by a conditional generative adversarial network (cGAN) generator. The implementation of the trained model may be achieved by a decoder in a conditional variational autoencoder in place of the cGAN. In other words, the function as the trained model is a data generative function trained by using a conditional generative adversarial network or a conditional variational autoencoder.

Figure 3:
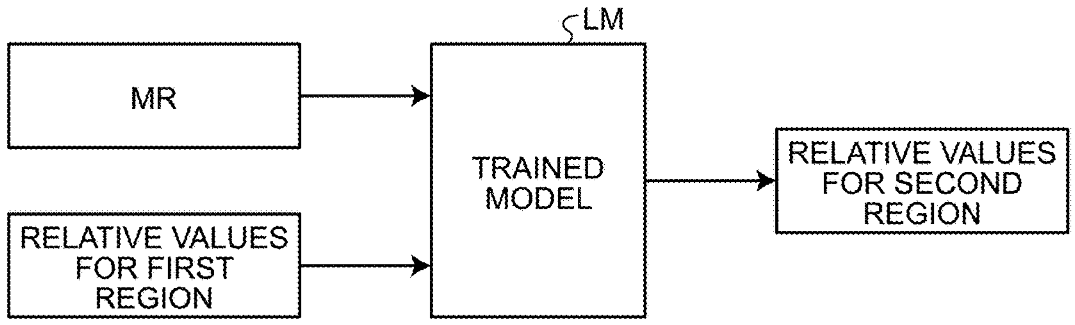
FIG. 3 illustrates an exemplary input and output relationship with respect to a trained model according to some embodiments.

FIG. 3 illustrates an input and output relationship with respect to a trained model LM as an example. As illustrated in FIG. 3, the computing function 22 inputs MR data and relative values for the first region (hereinafter, first relative values) to the trained model LM retrieved from the memory 8. The trained model LM then outputs relative values for the second region (hereinafter, second relative values) as output data. The computing function 22 stores the second relative values in the memory 8.

The processing circuitry 2 uses the output function 23 to output the output data. Specifically, the output function 23 outputs the output data from the trained model LM to various destinations via the communication interface 6. For example, the output function 23 outputs the output data to destinations including a display of the console in the MRI apparatus and/or a display of the radiogram interpretation terminal. In addition, the output function 23 may output superimposed data to such a display or displays as output data. The superimposed data is obtained by superimposing the relative values of the first region and the relative values of the second region on the morphological image in a different hue from the pixel values of the morphological image. The processing circuitry 2 implementing the output function 23 corresponds to an output unit. The output data is displayed for interpretation by a medical professional in order to perform a medical diagnosis.

Figure 4:
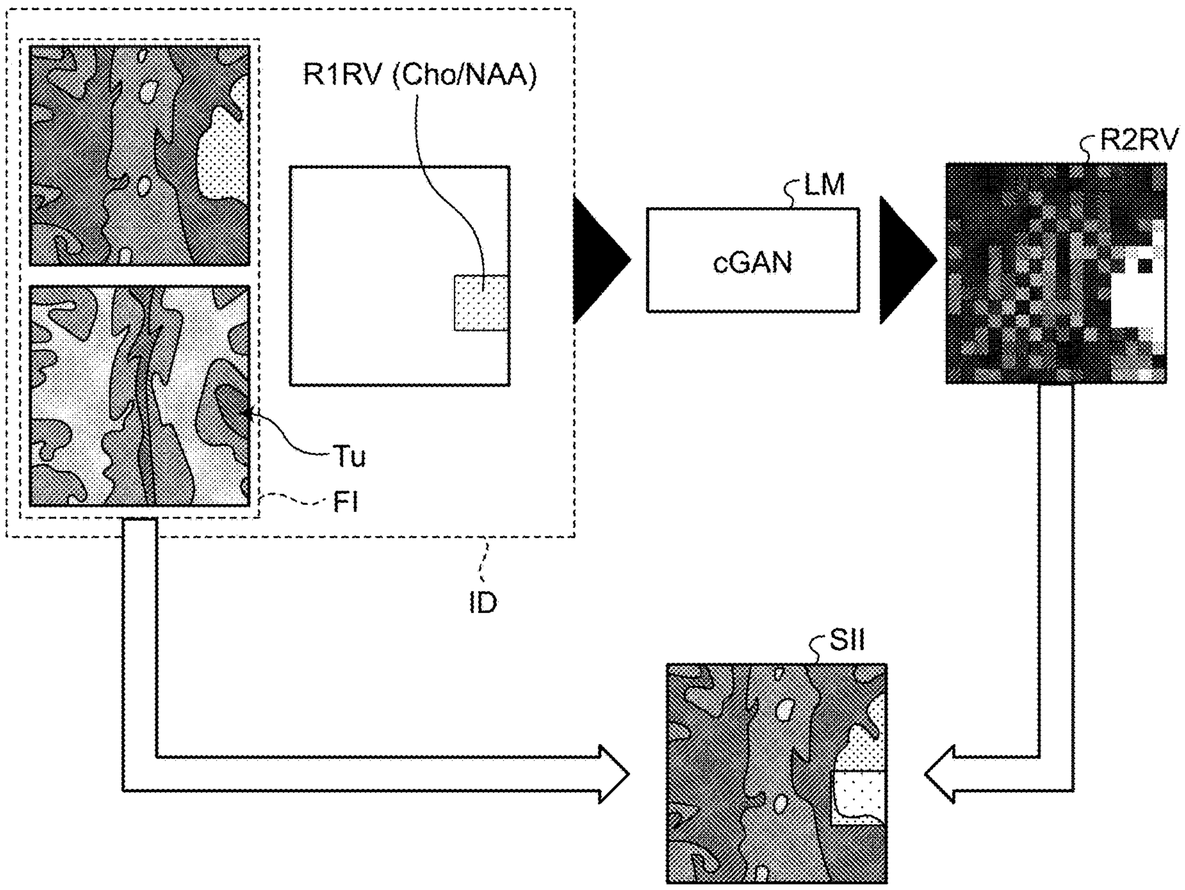
FIG. 4 illustrates input data to a cGAN being a trained model, a distribution of second relative values output from the cGAN, and a superimposed image generated by superimposing first relative values and second relative values on a morphological image according to some embodiments, by way of example.

FIG. 4 illustrates input data (morphological image FI and first relative values R1RV (Cho/NAA)) ID to a cGAN serving as the trained model LM, a distribution R2RV of second relative values (Cho/NAA) output from the cGAN, and a superimposed image SII of a morphological image with the first relative values and the second relative values superimposed thereon, by way of example. As illustrated in FIG. 4, the first relative values R1RV (Cho/NAA) represent the location of a tumor Tu appearing on the morphological image FI. As illustrated in FIG. 4, the distribution R2RV of the second relative values represents a distribution of relative values in the whole region equivalent to the morphological image.

Namely, the second region is the whole region including the first region in FIG. 4. The output function 23 outputs the superimposed image SII to a destination or destinations. Although FIG. 4 depicts two types of morphological image, the number of morphological images being input data is not limited to two. Any number or type of morphological images is adoptable. In such a case, the trained model LM may be trained in advance in accordance with a type of morphological images to be input or the size of the first region, for example.

The input interface 4 includes circuitry to receive various kinds of user instructions and information inputs. The input interface 4 includes circuitry related to, for example, a pointing device as a mouse or an input device as a keyboard. However, the circuitry included in the input interface 4 is not limited to such circuitry related to physical operational components as a mouse and a keyboard. For example, the input interface 4 may include electric-signal processing circuitry that receives electric signals corresponding to an input from an external input device separated from the data generation apparatus 1, to output the electric signals to various kinds of circuits of the data generation apparatus 1 or a pseudo data generation apparatus.

The communication interface 6 serves to exchange data with external apparatuses in a wired or wireless manner. For example, the communication interface 6 performs data communications with a workstation, an RIS server, or a PACS server.

The memory 8 stores therein the trained model and datasets of the first relative values, morphological images, the first region, the second relative values, and superimposed images, for example. The memory 8 can be implemented by, for example, a random access memory (RAM), a semiconductor memory device as a flash memory, a hard disk drive (HDD), a solid state drive (SSD), or an optical disk. In addition, the memory 8 can be a driver that reads and writes various kinds of information from and to a portable storage medium such as a CD-ROM drive, a digital versatile disc (DVD) drive, or a flash memory.

The overall structure and configuration of the data generation apparatus 1 according to some embodiments have been described above. With such structure and configuration, the data generation apparatus 1 of some embodiments performs processing for inputting input data to the trained model LM and outputting output data therefrom (hereinafter, referred to as a data generation process). A data generation procedure will be described below.

Figure 5:
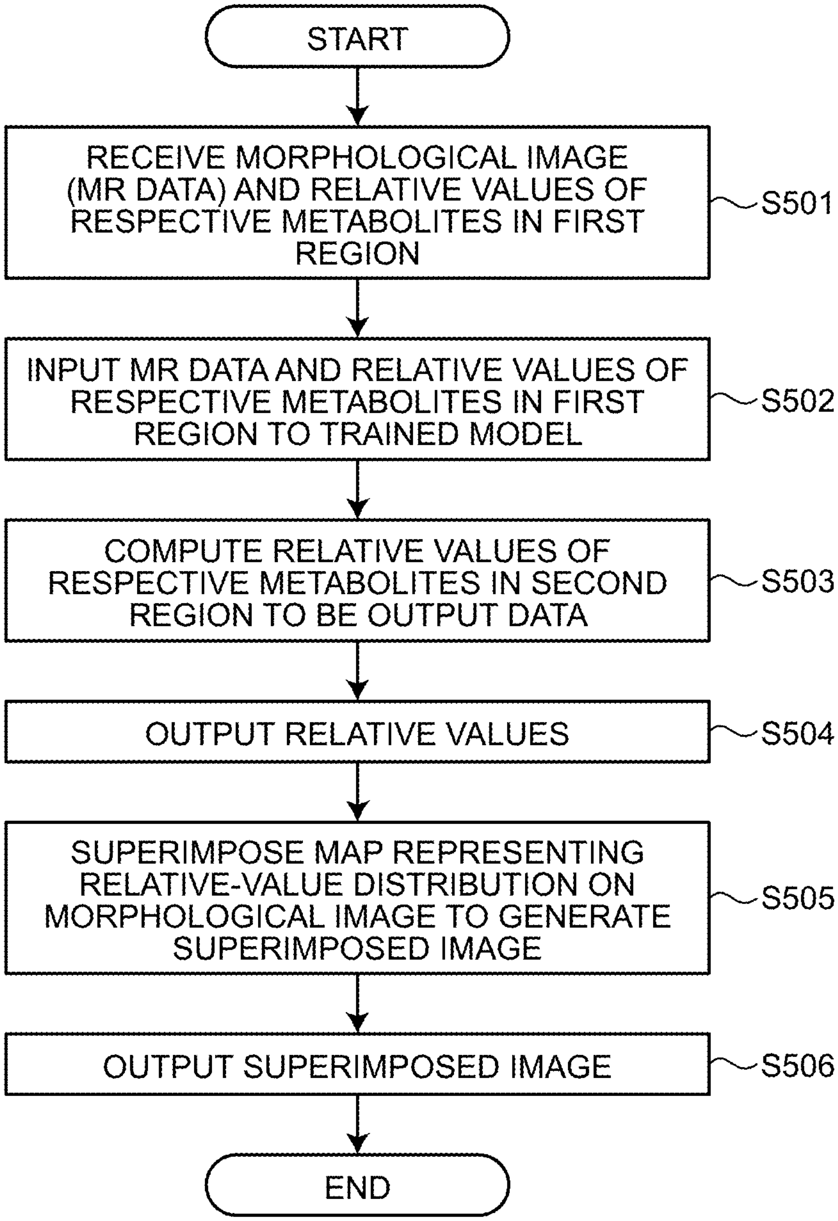
FIG. 5 is a flowchart illustrating an exemplary data generation procedure according to some embodiments.

FIG. 5 is a flowchart illustrating a data generation procedure as an example. For the sake of specificity, the flowchart of FIG. 5 is associated with a general outline of the data generation process in FIG. 4.

Data Generation Process

Step S501

The processing circuitry 2 uses the receiving function 21 to receive the morphological image (MR data) and the first relative values R1RV of the respective molecules in the first region R1. The receiving function 21 stores the MR data and the first relative values R1RV in the memory 8.

Step S502

The processing circuitry 2 uses the computing function 22 to retrieve the trained model LM (cGAN) from the memory 8.

The computing function 22 inputs the MR data (e.g., morphological image) and the first relative values R1RV of the respective molecules in the first region R1 to the trained model LM (cGAN).

Step S503

The processing circuitry 2 uses the computing function 22 to compute the second relative values R2RV of the respective molecules in the second region using the trained model LM. The computing function 22 thus computes the second relative values R2RV to be output data.

Step S504

The processing circuitry 2 uses the output function 23 to output the second relative values R2RV. The output function 23 outputs the distribution R2RV of the second relative values to the memory 8.

Step S505

The processing circuitry 2 uses the output function 23 to generate the superimposed image SII by superimposing a map representing the distribution R2RV of the second relative values on the morphological image FI. The superimposed image SII may be generated by the computing function 22 or an image processing function (not illustrated).

Step S506

The processing circuitry 2 uses the output function 23 to output the superimposed image SII to various displays and the memory 8. This completes the data generation process.

The following will describe generation of a trained model corresponding to the function used in the present embodiment. For the sake of specificity, a neural network to be trained (hereinafter, a non-trained model) is defined as a cGAN herein. Training data for the non-trained model includes multiple training datasets as to the first region R1 to be input to the non-trained model and multiple answer datasets relative to the training datasets as to the second region R1. Each of the training datasets is constituted of relative values of two metabolic substances in the first region R1 or a map representing a distribution of such relative values. Each of the answer datasets is constituted of a map representing a distribution of relative values of the two metabolic substances in the second region.

In the following, a single training dataset may be referred to as training data and a single answer dataset with respect to a single training dataset may be referred to as answer data, when appropriate. Each training dataset, i.e., training data, may additionally include a morphological image. Training data and answer data for use in training the non-trained model are prepared based on, for example, data acquired by MRS imaging of phantoms, a simulation, and/or literature values (for example, lesion data) specified in a research paper or else. Thus, known training data and known answer data include the relative values of the molecules which are prepared prior to training (i.e., before computation of the loss function during training).

Training of the non-trained model, i.e., generation of the trained model, is performed by a training device (not illustrated). Alternatively, the training or generation of the trained model may be performed by the data generation apparatus 1. The generated trained model may be subjected to additional training.

The function corresponding to the non-trained model is, for example, a data generative function adapted to a neural network such as a conditional generative adversarial network (cGAN) or a conditional variational autoencoder. The coefficients of the function correspond to weighted coefficients to be learned by the neural network. In the training process of a non-trained neural network, the coefficients are determined such that a loss function representing differences between results (hereinafter, training output) of applying the function to known training data and answer data relative to the training data decreases. The training output and the answer data for the training data can be discriminated using a discriminator (also referred to as a discriminative network). The training process of the non-trained model (function) can be implemented by any of known methods, therefore, a description thereof is omitted. An exemplary training process will be briefly explained in a third modification. The generated trained model is stored in the memory 8.

The data generation apparatus 1 of some embodiments described above receives the relative values of the molecules in the first region R1 as input data, computes the relative values of the molecules in the second region to be output data from the function by applying, to the input data, the function with the predetermined coefficients to be learned, and outputs the output data. The data generation apparatus 1 of some embodiments uses the data acquired by measuring the same subject as the input data. In the data generation apparatus 1 of some embodiments, the relative value represents a relationship between the molecules in a chemical shift band, for example. Specifically, the relative value is defined as a value obtained by dividing the density estimate of a first molecule by the density estimate of a second molecule among the molecules. For example, in the data generation apparatus 1 of some embodiments the molecular relative value is an estimate obtained by using any of MRS, MRSI, and CEST imaging.

The data generation apparatus 1 of some embodiments receives a morphological image including a two-dimensional or three-dimensional T1 weighted image, T2 weighted image, FLAIR image, T2* weighted image, diffusion weighted image, or proton density weighted image, to compute the output data by applying the function and the relative values of the molecules in the first region R1 to the morphological image. According to the data generation apparatus 1 of some embodiments, the second region includes a different region from the first region R1. According to the data generation apparatus 1 of some embodiments, the second region may have the same size as the first region R1 or may have a larger size than the first region R1.

Further, according to the data generation apparatus 1 of some embodiments, the coefficients of the function are determined such that the loss function representing differences between results of applying the function to known training data and answer data relative to the training data decreases. In the data generation apparatus 1 of some embodiments, the function is a data generative function trained by using a conditional generative adversarial network or a conditional variational autoencoder.

As such, the data generation apparatus 1 of some embodiments uses the trained model generated using the molecular relative values obtained from the measurements of the chemical shift signals. The trained model for use in the data generation apparatus 1 of some embodiments is generated by training the non-trained model using the molecular relative values. The training data including the relative values can be decreased in variation and signal to noise (S/N) ratio in comparison with the training data including no relative values. The data generation apparatus 1 of the present embodiment can thus decrease the variations in training data and improve the accuracy and precision of the deep generative model (trained model). As a result, the trained model used in the data generation apparatus 1 of some embodiments can generate more accurate or more reliable relative-value data of the molecules in the second region than the trained model trained by using no relative values.

Consequently, the data generation apparatus 1 of some embodiments can generate artificial parameter images (e.g., the relative-value distribution in the second region) reflecting reliable metabolic information, i.e., artificial data more approximate to actual data, by reducing the variations in training data to improve the accuracy and precision of the trained model (deep generative model) as compared with the traditional apparatuses. As such, the data generation apparatus 1 of the present embodiment can improve the examination of the subject and the research and study involving animal testing in terms of efficiency, for example.

First Modification

A first modification of some embodiments is now presented. The first modification concerns using measurements by CEST imaging (CEST measuring) in place of using the measurements by MRS imaging described in some embodiments. Thus, this modification adopts another chemical shift signal measuring method, e.g., CEST, in place of MRS.

Figure 6:
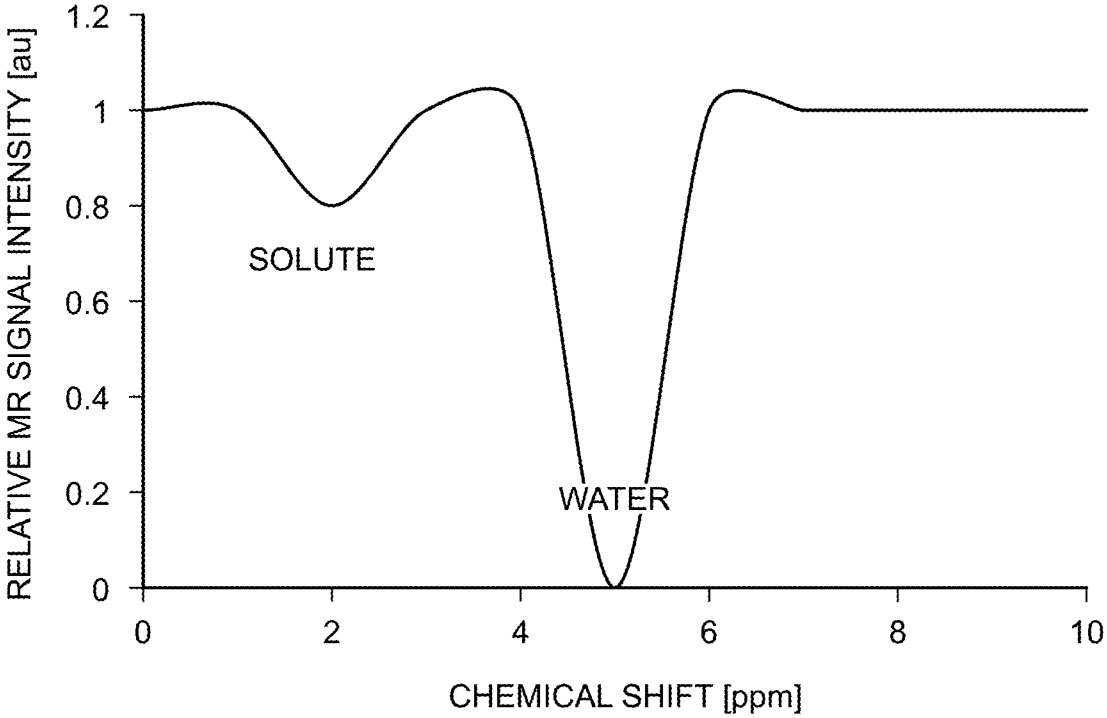
FIG. 6 schematically illustrates an example of a spectrum of protons in a minute amount of solute when chemically exchanged with bulk water according to a first modification of some embodiments.

FIG. 6 schematically illustrates an example of a spectrum of protons in a minute amount of solute when chemically exchanged with bulk water. The spectrum of FIG. 6 was obtained by CEST measuring. The spectrum of FIG. 6 will be referred to as a CEST spectrum. In the CEST spectrum of FIG. 6, the longitudinal axis represents relative MR-signal intensity values (arbitrary unit: a.u.) and the transverse axis represents differences from the reference frequency, i.e., chemical shift (ppm). Such CEST spectrum allows inference of a CEST signal corresponding to a sudden drop of the relative MR signal intensity value shown in FIG. 6 by computing the asymmetry of the relative MR signal in the chemical shift.

The relative values of the respective molecules in the first region R1 and the relative values of the respective molecules in the second region can be, for example, CEST-signal data about two molecules among an amino group of protein or peptide being the solute in FIG. 6, creatine, and glucosaminoglycan.

The data generation process of this modification is similar to that of some embodiments except for the CEST spectrum based on which the relative values are generated, therefore, a description thereof is omitted. Also, the effects of this modification are the same as or similar to those of some embodiments so that a description thereof is omitted.

Second Modification

A second modification concerns using, as the relative values, a ratio between an integrated signal value of first molecules (hereinafter, referred to as a first integral signal value) in a first chemical shift band and an integrated signal value of second molecules in a second chemical shift band (hereinafter, referred to as a second integral signal value) among the molecules in the first region R1. Herein, the relative value is defined as a second integral signal value relative to a first integral signal value for the sake of specificity. In addition, the first molecules are defined to be all the molecules in the spectrum SPE, and the second molecules are defined as NAA in the spectrum SPE, for example.

The first chemical shift band can be, for example, a wider range (0.5 to 5.0 ppm) in the spectrum SPE. The second chemical shift band can be, for example, a particular range (1.9 to 2.2 ppm) in the spectrum SPE. The first integral signal value corresponds to a value obtained by integrating the MR-signal intensities in the first chemical shift band of the spectrum SPE. The second integral signal value corresponds to a value obtained by integrating the MR-signal intensities in the second chemical shift band of the spectrum SPE.

Figure 7:
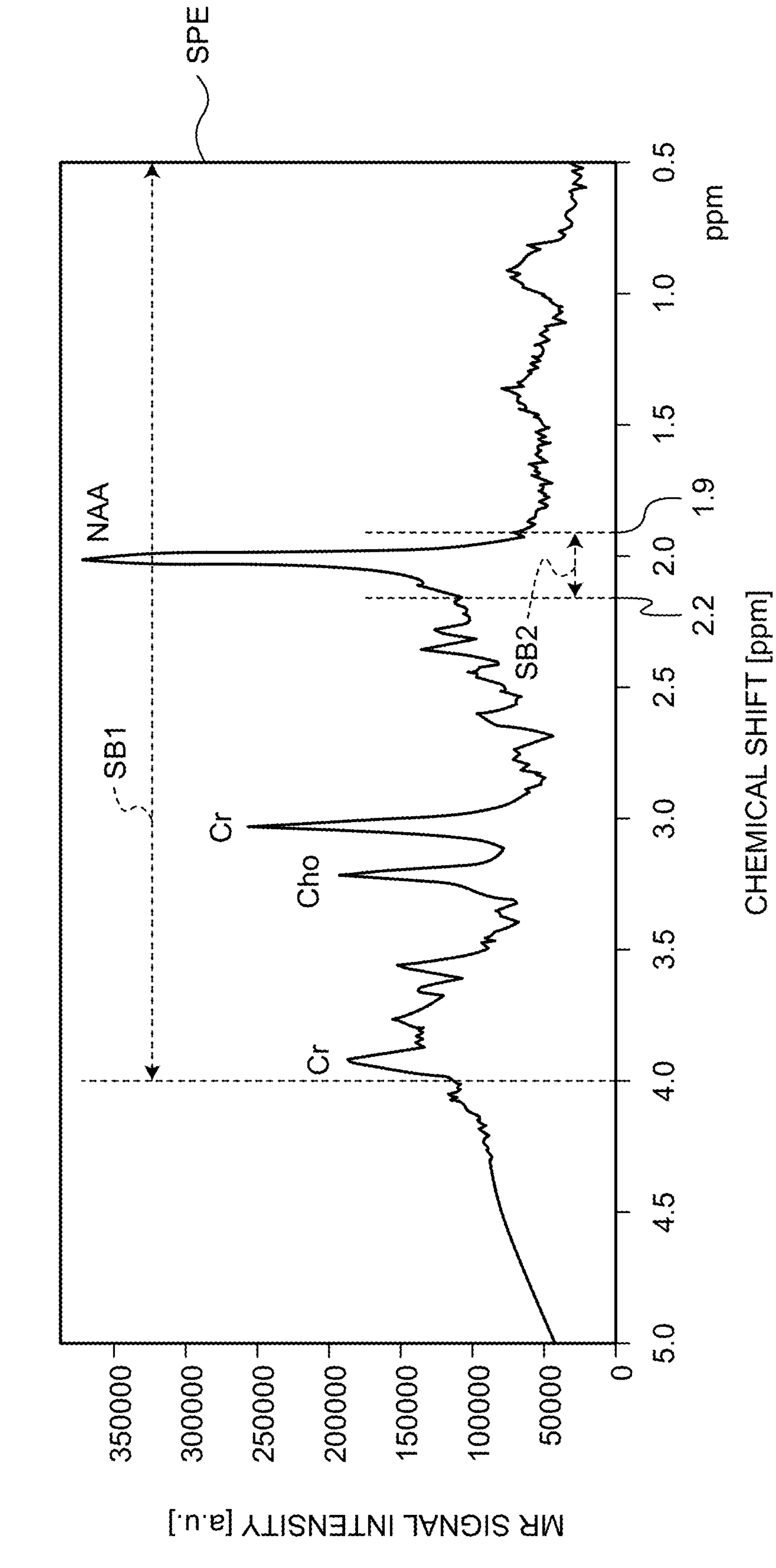
FIG. 7 illustrates an exemplary spectrum of intensities of MR signals in the first region according to a second modification of some embodiments.

FIG. 7 illustrates an example of the spectrum SPE of the intensities of MR signals in the first region R1. As illustrated in FIG. 7, a first chemical shift region SB1 is, for example, set to a range of 0.5 ppm to 5.0 ppm. As illustrated in FIG. 7, a second chemical shift region SB2 is set to, but not limited to, a range of 1.9 ppm to 2.2 ppm, for example. The relative value represents a spectral area ratio of a second spectrum band (1.9 to 2.2 ppm) being the particular range to a first spectrum band (0.5 to 5.0 ppm) being the wider range. Thus, in this modification the relationship between the molecules corresponds to the area ratio.

The data generation process of this modification is similar to that of some embodiments except for using the spectral area ratio as the relative value, therefore, a description thereof is omitted. Also, the effects of this modification are the same as or similar to those of some embodiments so that a description thereof is omitted.

Third Modification

A third modification concerns a trained model including a function of adjusting the resolution of the morphological image and the relative values of the first region to be input to the trained model. Specifically, the trained model of the third modification includes a preprocessing function for adjusting and combining the resolution with input data and a generative function for generating relative values of the second region based on intermediate data output from the preprocessing function.

For the sake of specificity, a map representing the relative values as input data (hereinafter, a MRS map) is defined as 1×8×8 voxels herein. The resolution of the MRS map is not limited to 1×8×8 voxels. Namely, the MRS map has a relative value at each of 8×8 pixels in a single slice. The morphological image as input data is defined to include two types of image (for example, T1 weighted image (T1*w*) and T2 weighted image (T2*w*)). The number of types of the morphological image is not limited to two but may be one or two or more. The number of pixels of each of the two morphological images is defined as 128×128 although the number of pixels, i.e., resolution of the morphological image is not limited to 128×128. The morphological image as input data is represented by 2 (two morphological image types)× 128×128, however, the resolution is not limited thereto. The morphological images as input data are defined to have the same resolution (e.g., the number of pixels), however, this is not construed as limiting. The morphological images may thus differ in resolution.

Figure 8:
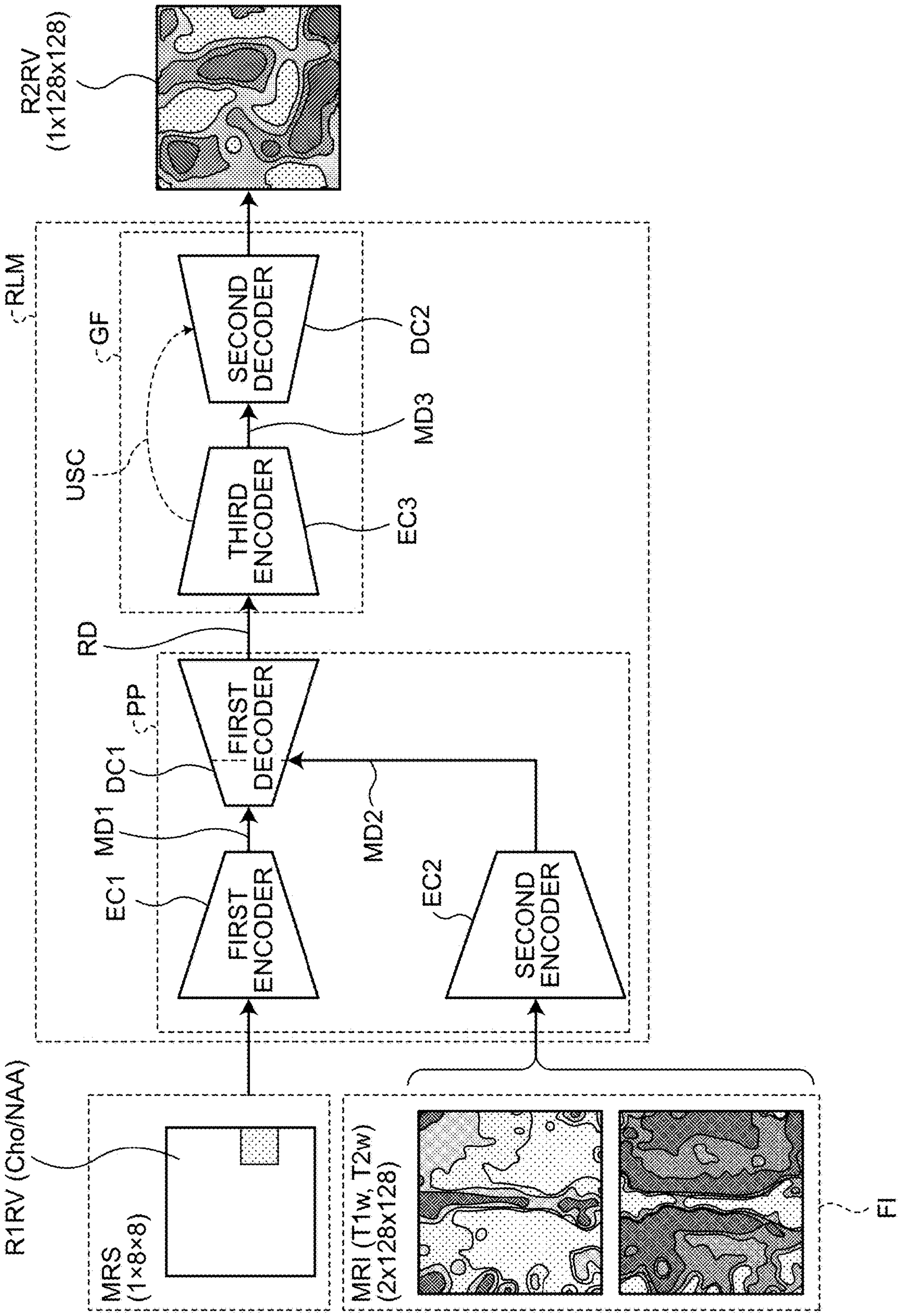
FIG. 8 illustrates an exemplary trained model according to a third modification of some embodiments.

FIG. 8 illustrates an exemplary trained model RLM in the third modification. The trained model RLM includes a preprocessing function PP and a generative function GF, as illustrated in FIG. 8. The preprocessing function PP includes, for example, a first encoder EC1, a first decoder DC1, and a second encoder EC2. In FIG. 8 the first encoder EC1, the first decoder DC1, and the second encoder EC2 are depicted as trapezoids schematically representing dimensional (e.g., resolution) compression (also referred to as downsampling or convolution) and decompression (also referred to as upsampling or deconvolution). The trained model RLM can be, for example, implemented by a conditional generative adversarial network or a conditional variational autoencoder.

As illustrated in FIG. 8, the computing function 22 inputs first relative values R1RV (Cho/NAA) generated by MRS to the first encoder EC1. The first encoder EC1 decreases the first relative values R1RV (Cho/NAA) in dimension to generate first intermediate data MD1 in accordance with the number of filters. The first intermediate data MD1 corresponds to a first feature vector representing the features of the first relative values R1RV (Cho/NAA) according to the number of filters (also referred to as kernels) included in the first encoder EC1. In other words, the first encoder EC1 corresponds to a process of extracting a feature amount of the first relative values R1RV (Cho/NAA). The generated first intermediate data MD1 is input to the first decoder DC1. In FIG. 8 the bottom width of the trapezoid schematically representing the first encoder EC1 corresponds to the resolution of the first relative values R1RV (Cho/NAA).

The computing function 22 inputs two types of morphological images (T1 weighted image T1*w* and T2 weighted image T2*w*) FI to the second encoder EC2. The second encoder EC decreases the two types of morphological images in dimension to generate second intermediate data MD2 in accordance with the number of filters. The second intermediate data MD2 corresponds to a second feature vector representing the features of the morphological images FI according to the number of filters (kernels) included in the second encoder EC2. In other words, the second encoder EC2 corresponds to a process of extracting a feature amount of the morphological images FI.

The dimensional compression (resolution reduction) by the second encoder EC2 is preset. In FIG. 8 the bottom width of the trapezoid schematically representing the first encoder EC1 corresponds to the resolution of the morphological image FI. The generated second intermediate data MD2 is input to the first decoder DC1. With respect to the morphological images with different resolutions, for example, the second encoder EC2 encodes the morphological image with a higher resolution to a lower resolution, and the morphological image with a lower resolution is input to an intermediate layer subsequent to the lower resolution in question in the second encoder EC2.

The first decoder DC1 has the first intermediate data MD1 and the second intermediate data MD2 input thereto. The first decoder DC1 decompresses (upsampling) the input data to a predetermined resolution through the filters (kernels). For the sake of specificity, the predetermined resolution is defined as 1×128×128 (same resolution as one morphological image) herein. The predetermined resolution may be freely set during the trained-model generation process. The first decoder DC1 inputs decompressed intermediate data (hereinafter, decompressed data) RD to the third encoder EC3.

The second intermediate data MD2 is input to an intermediate layer of the first decoder DC1, the intermediate layer of which is subsequent to an intermediate layer in which the first intermediate data decompressed by the first decoder DC1 matches the second intermediate data MD2 in resolution. Namely, the intermediate layer of the first decoder DC1 where the second intermediate data MD2 is input is next to the intermediate layer where the first intermediate data MD reaches the second intermediate data MD2 in resolution in the decompression process of the first decoder DC1. In FIG. 8 the length of the broken line inside the first decoder DC1 corresponds to the top width of the trapezoid schematically representing the second encoder EC2.

The generative function GF includes, for example, a third encoder EC3 and a second decoder DC2. In FIG. 8 the third encoder EC3 and the second decoder DC2 are depicted as trapezoids schematically representing dimensional (e.g., resolution) compression and decompression. For the sake of specificity, the third encoder EC3 and the second decoder DC2 are defined to be implemented by U-net herein. The implementation of the third encoder EC3 and the second decoder DC2 is not limited to the U-net and may be any other neural network. The generative function GF implemented by the U-net may additionally include a skip connection USC between the third encoder EC3 and the second decoder DC2 at the same resolution, as illustrated in FIG. 8. The U-net is an existing technique, so that a description thereof is omitted.

The third encoder EC3 decreases the decompressed data RD in dimension to generate third intermediate data MD3 in accordance with the number of filters. The third intermediate data MD3 corresponds to a third feature vector representing the features of the decompressed data RD according to the number of filters (kernels) included in the third encoder EC3. In other words, the third intermediate data MD3 corresponds to a process of extracting a feature amount of the decompressed data RD. The generated third intermediate data MD3 is input to the second decoder DC2. In FIG. 8 the bottom width of the trapezoid schematically representing the third encoder EC3 corresponds to the resolution (the bottom width of the trapezoid representing the first decoder DC1) of the decompressed data RD.

The second decoder DC2 has the third intermediate data MD3 input thereto. With the skip connection USC provided, an output from a certain intermediate layer of the third encoder EC3 is input through the skip connection USC to an intermediate layer of the second decoder DC2 with a resolution corresponding to the certain intermediate layer. The second decoder DC2 decompresses (upsampling) the input data to a predetermined resolution through the filters (kernels). The second decoder DC2 outputs a distribution R2RV of the second relative values (Cho/NAA) at a resolution of 128×128.

Figure 9:
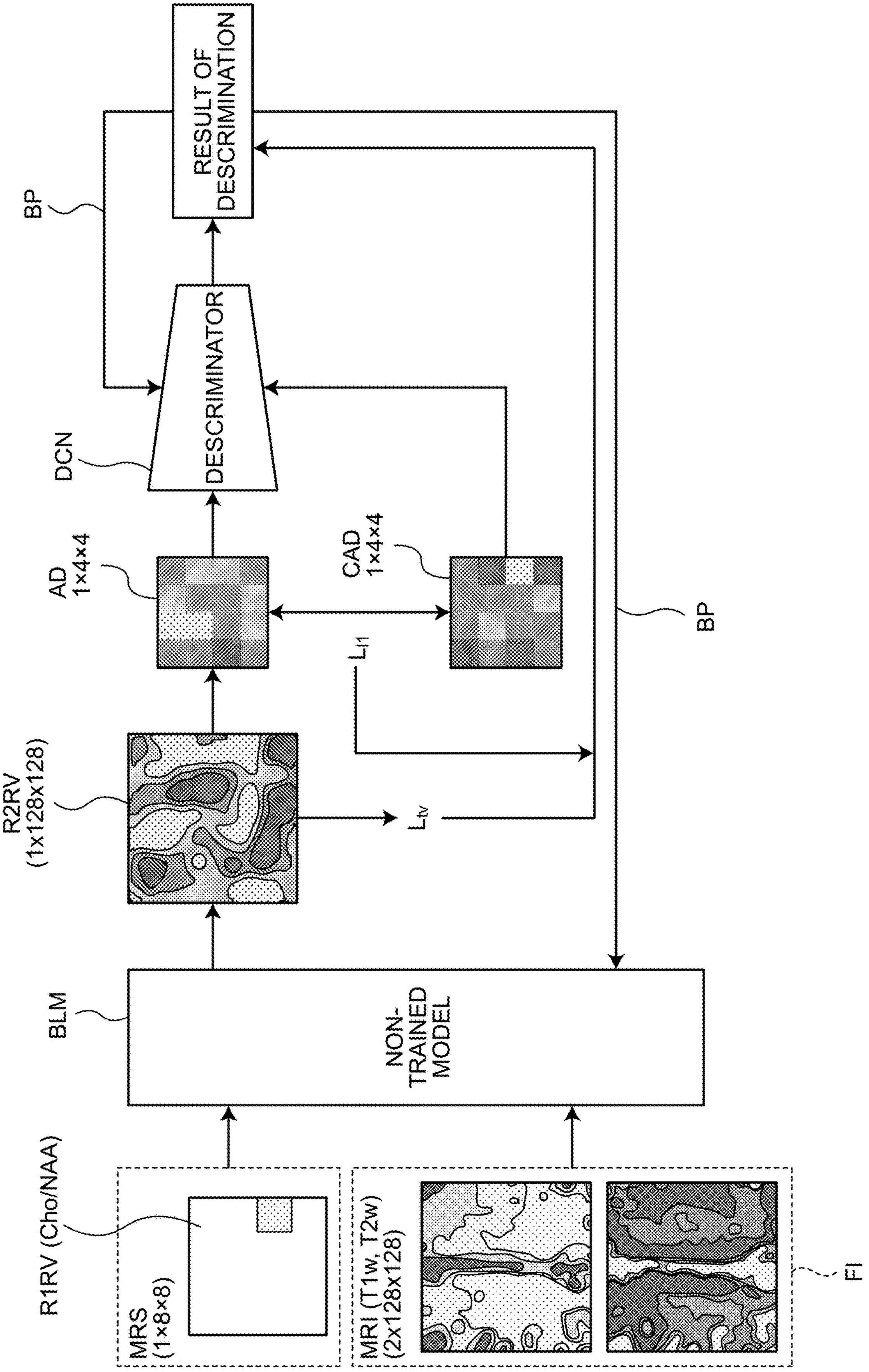
FIG. 9 illustrates an exemplary outline of a training process of a non-trained model according to the third modification of some embodiments.

Generation of a function (trained model RLM) for use in this modification will be described below with reference to FIG. 9. FIG. 9 illustrates a general outline of the training process of a non-trained model BLM to become the trained model RLM as an example.

For the sake of specificity, answer data CAD that a discriminator DCN uses for comparison is defined as a relative-value distribution with a resolution of 1×4×4 generated by MRS imaging. The answer data with a resolution of 1×4×4 can be actual measurement data. Thus, an object to be compared with the answer data will be a distribution (hereinafter, average distribution) AD of 1×4×4 relative values as a result of applying average pooling to the training output TO. For example, an L1 loss $L_{l1}$ can be computed from the average distribution AD and the answer data CAD. For another example, an adversarial loss $L_D$ can be computed based on a result of the discrimination by the discriminator DCN. The L1 loss $L_{l1}$ and the adversarial loss $L_D$ can be computed by the following equations:

$$L_{l1}=\mathbb{E}_{x,y,z}[\|y-G(x,z)\|_1]$$

$$L_D=\mathbb{E}_{x,y}[\log D(x,y)]+\mathbb{E}_{x,z}[\log(1-D(x,G(x,z))]$$

The symbols appearing on the right side of the L1 loss $L_{l1}$ and the adversarial loss $L_D$ base on a non-patent literature "Phillip Isola, Jun-Yan Zhu, Tinghui Zhou, and Alexei A. Efros, Image-to-Image Translation with Conditional Adversarial Networks, arXiv:1611.07004, Online, Nov. 26, 2018, Internet URL: https://arxiv.org/abs/1611.07004", therefore, a description thereof is omitted.

A total variation loss $L_{tv}$ representing the smoothness of the training output TO is then computed based on the training output TO, i.e., the distribution of 1×128×128 relative values. The total variation loss $L_{tv}$ can be computed by, for example, the following equation:

$$L_{tv}=\Sigma_{i,j}(|x_{i+j}-x_{i,j}|+|x_{i,j+1}-x_{i,j}|)$$

The symbol "x" on the right side of the total variation loss $L_{tv}$ indicates an image included in the training output. The indexes "i" and "j" attached to "x" indicate, for example, a row number and a column number representing a pixel position. The equation for computing the total variation loss $L_{tv}$ relative to the image x in the training output may be any other equation, in addition to the above equation.

Two hyper parameters $\lambda_{l1}$ and $\lambda_{tv}$ can be preset for the L1 loss $L_{l1}$ and the total variation loss $L_{tv}$, respectively. The loss function can be defined by using the L1 loss $L_{l1}$, adversarial loss $L_D$, total variation loss $L_{tv}$, and two hyper parameters ($\lambda_{l1}$ and $\lambda_{tv}$), as follows:

$$L_D+L_{l1}\times\lambda_{l1}+L_{tv}\times\lambda_{tv}$$

For example, the non-trained model BLM (e.g., U-net including the third encoder EC3 and the second decoder DC2) and the discriminator DCN in the generative function GF are trained such that the loss defined by the loss function decreases. Any of known methods (e.g., error back-propagation BP) may be adoptable for the training process of the cGAN including the U-net, therefore, a description thereof is omitted. Similarly, the first encoder EC1, the first decoder DC1, and the second encoder EC2 included in the preprocessing function PP may be trained in such a manner that the loss defined by the loss function decreases.

The data generation process of this modification is similar to that of some embodiments except for the trained model RLM including the preprocessing function PP and the generative function GF, therefore, a description thereof is omitted. Further, the data generation apparatus 1 according to this modification can combine the input datasets in the intermediate layer of the second decoder DC2 of the preprocessing function PP in accordance with a result of encoding data to be input to the trained model RLM, i.e., the resolution of the intermediate data. As such, the data generation apparatus 1 of this modification can combine input datasets with different resolutions by properly adjusting the resolutions, to be thereby able to generate reliable data. Such an adjustment method can be an interpolation or implemented by an encoder or a decoder. The rest of the effects of this modification is similar to or the same as those of some embodiments, so that a description thereof is omitted.

Fourth Modification

A fourth modification concerns using other images as input data to the trained model in addition to the morphological images. As an example, the processing circuitry 2 uses the receiving function 21 to receive an analysis image which is obtained by analyzing the morphological image. The data generation apparatus 1 may include an analyzing function (not illustrated) to analyze the received morphological image to generate an analysis image. The processing circuitry 2 then uses the computing function 22 to input the first relative values R1RV of the respective molecules in the first region R1 and the analysis image to the trained model LM. In this manner the computing function 22 generates artificial data, i.e., the second relative values R2RV of the second region, using the first relative values R1RV, the analysis image, and the trained model LM.

The analysis image can be, for example, a quantitative image of a magnetic resonance parameter deriving from the tissues of the subject such as a T1 map or a T2 map, and a segmentation image of the tissues. The quantitative image is not limited to a T1 map or T2 map, and may be any other map representing another quantitative value. As for the morphological image including the brain region of the subject, the segmentation image of the tissues represents, for example, white matter (WM), gray matter (GM), or cerebrospinal fluid (CSF). The metabolic substances differ in density depending on the tissues (e.g., brain region such as gray matter or white matter) of the subject.

Figure 10:
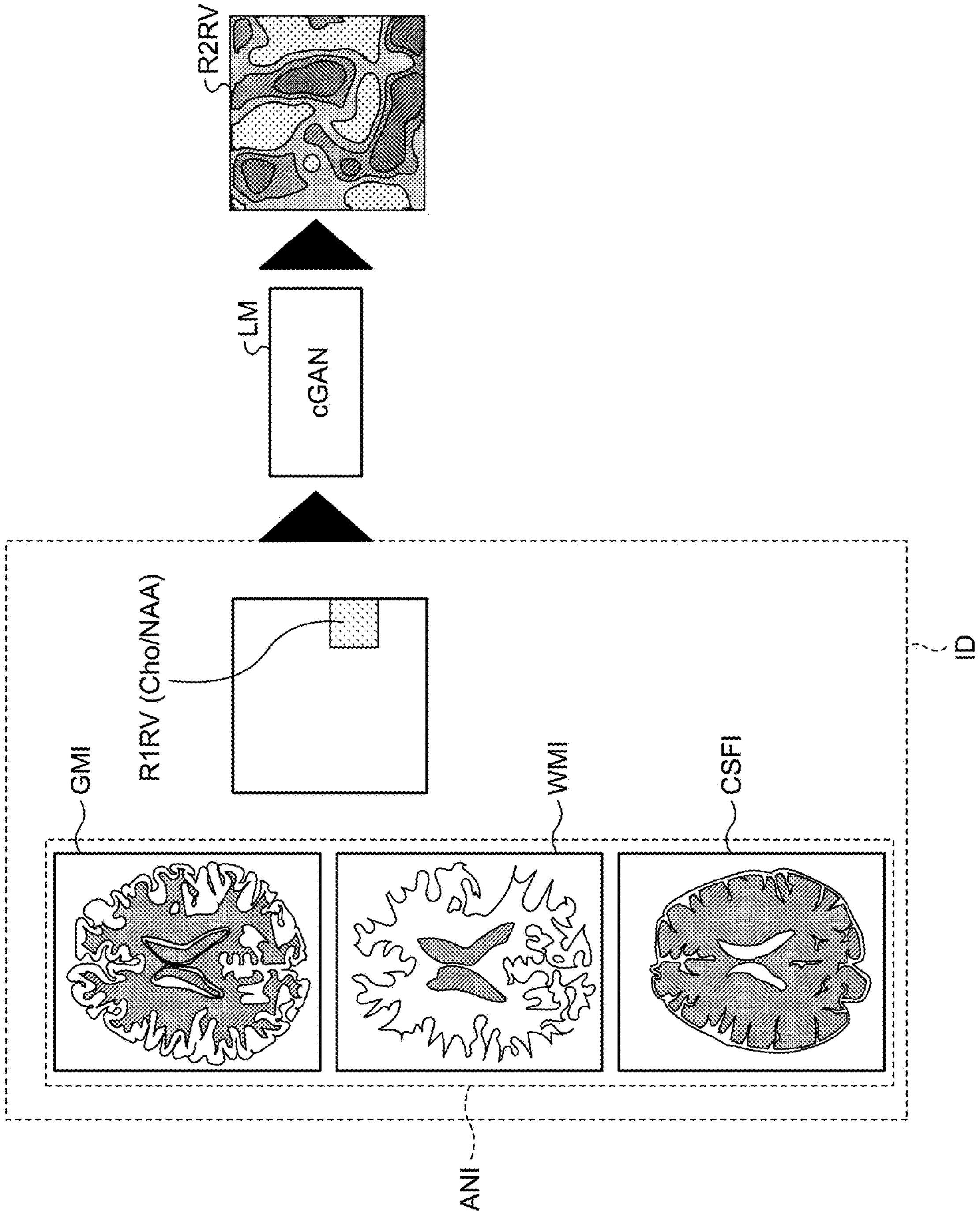
FIG. 10 illustrates input data to a cGAN being a trained model and a distribution of second relative values output from the cGAN according to a fourth modification of some embodiments, by way of example.

FIG. 10 illustrates input data (analysis image ANI and first relative values R1RV (Cho/NAA)) ID to the cGAN being the trained model LM and a distribution R2RV of second relative values (Cho/NAA) output from the cGAN, as an example. As illustrated in FIG. 10, the analysis image ANI includes a gray matter image GMI, a white matter image WMI, and a cerebrospinal fluid image CSFI. The gray matter image GMI, the white matter image WMI, and the cerebrospinal fluid image CSFI are segmentations (extracted regions) of the gray matter, the white matter, and the cerebrospinal fluid from the morphological image, respectively. In FIG. 10, the three analysis images are input to the cGAN as the trained model LM, however, the number of input images to the trained model LM is not limited to three. In addition, the input images to the trained model LM can be both the morphological image and the analysis image.

The data generation process of this modification is similar to that of some embodiments except for using the analysis image as the input image to the trained model LM, therefore, a description thereof is omitted. Also, the effects of this modification are the same as or similar to those of some embodiments so that a description thereof is omitted.

To implement the technical idea of some embodiments by a data generation method, the data generation method includes receiving a relative value of molecules in a first region as input data; applying a function to the input data, the function having predetermined coefficients to be learned; computing a relative value of the molecules in a second region to be output data from the function; and outputting the output data. The procedure and effects of the data generation process executed by the data generation method are the same as or similar to those of some embodiments, so that a description thereof is omitted.

To implement the technical idea of some embodiment by a data generation program, the data generation program causes a computer to execute receiving a relative value of molecules in a first region as input data; applying a function to the input data, the function having predetermined coefficients to be learned; computing a relative value of the molecules in a second region to be output data from the function; and outputting the output data.

For example, the data generation process can be implemented by installing the data generation program in a computer in a modality such as an MRI apparatus, a PACS server, or any image processing server to load the program into a memory. The program for causing the computer to execute the data generation process can be stored and distributed in a storage medium such as a magnetic disk (e.g., hard disk), an optical disk (e.g., CD-ROM or DVD), or a semiconductor memory. The procedure and effects of the data generation process by the data generation program are the same as or similar to those of some embodiments so that a description thereof is omitted.

According to at least one of the above-described embodiments and the modifications, it is made possible to generate reliable data.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

With respect to the embodiments and modifications as above, the following subjoinders describing an aspect and selective features of the inventions will be presented.

Subjoinder 1

A data generation apparatus is provided, which includes a receiver unit configured to receive a relative value of molecules in a first region as input data; a computing unit configured to apply a function to the input data and compute a relative value of the molecules in a second region to be output data from the function, the function having predetermined coefficients to be learned; and an output unit configured to output the output data.

Subjoinder 2

The receiver unit may receive a morphological image including the first region and the second region as input data. The computing unit may compute the relative value of the molecules in the second region by using the relative value of the molecules in the first region and the morphological image as input data.

Subjoinder 3

The input data may include data acquired by measuring a same subject. The relative value of the molecules in the first region and the morphological image are data acquired by measuring the same subject.

Subjoinder 4

The relative value may represent a relationship between the molecules in a chemical shift band.

Subjoinder 5

The relative value may be obtained by dividing a density estimate of a first molecule by a density estimate of a second molecule among the molecules.

Subjoinder 6

The relative value of the molecules may be an estimate obtained by using any of magnetic resonance spectroscopy, magnetic resonance spectroscopic imaging, and chemical exchange saturation transfer imaging.

Subjoinder 7

The receiver unit may receive a morphological image including a two-dimensional or three-dimensional T1 weighted image, T2 weighted image, fluid attenuated inversion recovery (FLAIR) image, T2* weighted image, diffusive weighted image, or proton density weighted image. The computing unit may compute the output data by applying the function and the relative value of the molecules in the first region to the morphological image.

Subjoinder 8

The second region may include a region different from the first region.

Subjoinder 9

The first region and the second region may be set on different slices.

Subjoinder 10

The second region may be the same as or larger than the first region in size.

Subjoinder 11

The coefficients may be determined in such a manner that a loss function decreases. The loss function represents a difference between a result of applying the function to known training data and answer data relative to the known training data. The answer data may be target data or ground truth data.

Subjoinder 12

The function may be a data generative function trained by using a conditional generative adversarial network or a conditional variational autoencoder.

Subjoinder 13

The relative value may represent a ratio between an integral signal value of a first molecule in a first chemical shift band and an integral signal value of a second molecule in a second chemical shift band among the molecules.

Subjoinder 14

The known training data and the answer data may include relative values of the molecules which are prepared prior to computation of the loss function.

Subjoinder 15

The output unit may superimpose the relative value of the molecules in the first region and the relative values of the molecules in the second region on the morphological image and output the superimposed image data.

Subjoinder 16

The data generation apparatus may be an image processing apparatus. The data generation apparatus may be a medical image processing apparatus.

Subjoinder 17

The function may be implemented by a trained model.

Subjoinder 18

A further data generation apparatus is provided, which includes a receiver unit configured to receive a relative value of molecules in a first region as input data; a computing unit configured to apply a function to the input data and compute a relative value of the molecules in a second region to be output data from the function; and an output unit configured to output the output data. The function may comprise a trained model.

Subjoinder 19

A data generation method is provided, which includes receiving a relative value of molecules in a first region as input data; applying a function to the input data, the function having predetermined coefficients to be learned; computing a relative value of the molecules in a second region to be output data from the function; and outputting the output data.

Subjoinder 20

A further data generation method is provided, which includes receiving a relative value of molecules in a first region as input data; applying a function to the input data; computing a relative value of the molecules in a second region to be output data from the function; and outputting the output data.

Subjoinder 21

A data generation program is provided, which causes a computer to execute receiving a relative value of molecules in a first region as input data; applying a function to the input data, the function having predetermined coefficients to be learned; computing a relative value of the molecules in a second region to be output data from the function; and outputting the output data.

Subjoinder 22

A further data generation program is provided, which causes a computer to execute receiving a relative value of molecules in a first region as input data; applying a function to the input data; computing a relative value of the molecules in a second region to be output data from the function; and outputting the output data.

Subjoinder 23

A method of generating a trained model is provided, comprising:

receiving a relative value of molecules in a first region as training data;

applying a function to the training data, the function corresponding to the non-trained model;

determining coefficients of the function in such a manner that a loss function decreases, the loss function representing a difference between the result of applying the function to the training data, and answer data including a relative value of the molecules.

Subjoinder 24

A training apparatus is provided, configured to: receive a relative value of molecules in a first region as training data;

apply a function to the training data, the function corresponding to the non-trained model;

determine coefficients of the function in such a manner that a loss function decreases, the loss function representing a difference between the result of applying the function to the training data, and answer data including a relative value of the molecules.

What is claimed is:

1. A data generation apparatus, comprising:

processing circuitry configured to:

receive a first relative value of molecules in a first region and a morphological image including the first region and a second region;

apply the first relative value and the morphological image to a trained model, the trained model having predetermined coefficients to be learned;

compute a second relative value of the molecules in the second region as output data from the trained model; and output the output data, wherein the first and second relative values each represent a density estimate of a first molecule divided by a density estimate of a second molecule among the molecules, the first relative value and the morphological image are acquired by measuring a same subject, and the second region includes a region different from the first region.

2. The data generation apparatus according to claim 1, wherein the first and second relative values each represent a relationship between the molecules in a chemical shift band.

3. The data generation apparatus according to claim 1, wherein the first relative value of the molecules is obtained by using any of magnetic resonance spectroscopy, magnetic resonance spectroscopic imaging, and chemical exchange saturation transfer (CEST) imaging.

4. The data generation apparatus according to claim 1, wherein the processing circuitry is further configured to:

receive the morphological image, which includes a two-dimensional or three-dimensional T1 weighted image, a T2 weighted image, a fluid attenuated inversion recovery (FLAIR) image, a T2* weighted image, a diffusive weighted image, or a proton density weighted image, and compute the output data by applying the first relative value of the molecules in the first region and the morphological image to the trained model.

5. The data generation apparatus according to claim 1, wherein the first region and the second region are set on different slices.

6. The data generation apparatus according to claim 1, wherein the second region is a same size as or larger than the first region.

7. The data generation apparatus according to claim 1, wherein the coefficients are determined in such a manner that a loss function decreases, the loss function representing a difference between a result of applying the trained model to known training data and answer data relative to the known training data.

8. The data generation apparatus according to claim 7, wherein the trained model is a data generative function trained by using a conditional generative adversarial network or a conditional variational autoencoder.

9. The data generation apparatus according to claim 1, wherein the first and second relative values each represent a ratio between an integral signal value of a first molecule in a first chemical shift band and an integral signal value of a second molecule in a second chemical shift band among the molecules.

10. The data generation apparatus according to claim 7, wherein the known training data and the answer data include a relative value of the molecules, the relative value being prepared prior to computation of the loss function.

11. A data generation method, comprising:

receiving a first relative value of molecules in a first region and a morphological image including the first region and a second region;

applying the first relative value and the morphological image to a trained model, the trained model having predetermined coefficients to be learned;

computing a second relative value of the molecules in the second region as output data from the trained model; and outputting the output data, wherein the first and second relative values each represent a density estimate of a first molecule divided by a density estimate of a second molecule among the molecules, the first relative value and the morphological image are acquired by measuring a same subject, and the second region includes a region different from the first region.

12. A non-transitory computer-readable storage medium storing a data generation program which causes a computer to execute:

receiving a first relative value of molecules in a first region and a morphological image including the first region and a second region;

applying the first relative value and the morphological image to a trained model, the trained model having predetermined coefficients to be learned;

computing a second relative value of the molecules in the second region as output data from the trained model; and outputting the output data, wherein the first and second relative values each represent a density estimate of a first molecule divided by a density estimate of a second molecule among the molecules, the first relative value and the morphological image are acquired by measuring a same subject, and the second region includes a region different from the first region.

* * * * *